United States Patent
Byrd

(10) Patent No.: US 6,181,616 B1
(45) Date of Patent: Jan. 30, 2001

(54) CIRCUITS AND SYSTEMS FOR REALIGNING DATA OUTPUT BY SEMICONDUCTOR TESTERS TO PACKET-BASED DEVICES UNDER TEST

(75) Inventor: Phillip E. Byrd, Boise, ID (US)

(73) Assignee: Micron Technology, Inc., Boise, ID (US)

(*) Notice: Under 35 U.S.C. 154(b), the term of this patent shall be extended for 0 days.

(21) Appl. No.: 09/293,203

(22) Filed: Apr. 16, 1999

Related U.S. Application Data

(63) Continuation-in-part of application No. 09/146,629, filed on Sep. 3, 1998.

(51) Int. Cl.⁷ .................................................. G11C 7/00
(52) U.S. Cl. ........................................ 365/201; 365/189.01
(58) Field of Search .............................. 365/201, 189.01, 365/230.01; 371/21.1, 21.2, 21.5

(56) References Cited

U.S. PATENT DOCUMENTS

| | | |
|---|---|---|
| 4,363,094 | 12/1982 | Kaul et al. . |
| 5,400,282 * | 3/1995 | Suzuki et al. ........................ 365/201 |
| 5,442,642 | 8/1995 | Ingalls et al. . |
| 5,499,248 | 3/1996 | Behrens et al. . |
| 5,553,025 | 9/1996 | Haraguchi . |
| 5,708,614 | 1/1998 | Koshikawa . |
| 5,758,063 | 5/1998 | Lindsay et al. . |

OTHER PUBLICATIONS

Draft Standard for A High–Speed Memory Interface (SyncLink). Microprocessor and Microcomputer Standard Subcommittee of the IEEE Computer Society, 1996.
400 Mb/s/pin SLDRAM 4M ×18 SLDRAM Draft Advance. SLDRAM, Inc., 1998.

* cited by examiner

Primary Examiner—Vu A. Le
(74) Attorney, Agent, or Firm—Trask Britt

(57) ABSTRACT

Circuits and systems for testing packet-based semiconductor devices by using facilitated test data packets are disclosed. Facilitated test data packets may be generated by conventional memory testers. The facilitated test data packets are realigned to another, different format automatically or by test mode circuitry located on circuit die, integrated circuit package, test interface, or semiconductor tester prior to testing the device under test. The data realignment may be synchronized by one or more timing signals. The circuits and systems described potentially reduces the number of pieces of data which must be generated using an algorithmic pattern generator (APG) on a per pin basis. Furthermore, the circuits and systems disclosed potentially reduce the number of packet words that have data generated from both an APG and vector memory.

25 Claims, 9 Drawing Sheets

| | Flag | CA9 | CA8 | CA7 | CA6 | CA5 | CA4 | CA3 | CA2 | CA1 | CA0 |
|---|---|---|---|---|---|---|---|---|---|---|---|
| | 0<br>vm | x | x | x | x | x | x | x | x | x | x |
| WORD 0 | 1<br>vm | ID8<br>vm | ID7<br>vm | ID6<br>vm | ID5<br>vm | ID4<br>vm | ID3<br>vm | ID2<br>vm | ID1<br>vm | ID0<br>vm | 0<br>vm |
| WORD 1 | 0<br>vm | CMD4<br>vm | CMD3<br>vm | CMD2<br>vm | CMD1<br>vm | CMD0<br>vm | 0<br>vm | 0<br>vm | 0<br>vm | 0<br>vm | CMD5<br>vm |
| WORD 2 | 0<br>vm | ROW7<br>apg | ROW6<br>apg | ROW5<br>apg | ROW4<br>apg | ROW3<br>apg | ROW2<br>apg | ROW1<br>apg | ROW0<br>apg | ROW9<br>apg | ROW8<br>apg |
| WORD 3 | 0<br>vm | BNK2<br>apg | BNK1<br>apg | BNK0<br>apg | COL6<br>apg | COL5<br>apg | COL4<br>apg | COL3<br>apg | COL2<br>apg | COL1<br>apg | COL0<br>apg |

|        | Flag | CA9 | CA8 | CA7 | CA6 | CA5 | CA4 | CA3 | CA2 | CA1 | CA0 |
|--------|------|-----|-----|-----|-----|-----|-----|-----|-----|-----|-----|
|        | 0 vm | x | x | x | x | x | x | x | x | x | x |
| WORD 0 | 1 vm | ID8 vm | ID7 vm | ID6 vm | ID5 vm | ID4 vm | ID3 vm | ID2 vm | ID1 vm | ID0 vm | CMD5 vm |
| WORD 1 | 0 vm | CMD4 vm | CMD3 vm | CMD2 vm | CMD1 vm | CMD0 vm | BNK2 apg | BNK1 apg | BNK0 apg | ROW9 apg | ROW8 apg |
| WORD 2 | 0 vm | ROW7 apg | ROW6 apg | ROW5 apg | ROW4 apg | ROW3 apg | ROW2 apg | ROW1 apg | ROW0 apg | 0 vm | 0 vm |
| WORD 3 | 0 vm | 0 vm | 0 vm | 0 vm | COL6 apg | COL5 apg | COL4 apg | COL3 apg | COL2 apg | COL1 apg | COL0 apg |

FIG 1. (Prior Art)

|        | Flag | CA9 | CA8 | CA7 | CA6 | CA5 | CA4 | CA3 | CA2 | CA1 | CA0 |
|--------|------|-----|-----|-----|-----|-----|-----|-----|-----|-----|-----|
|        | 0 vm | x | x | x | x | x | x | x | x | x | x |
| WORD 0 | 1 vm | ID8 vm | ID7 vm | ID6 vm | ID5 vm | ID4 vm | ID3 vm | ID2 vm | ID1 vm | ID0 vm | 0 vm |
| WORD 1 | 0 vm | CMD4 vm | CMD3 vm | CMD2 vm | CMD1 vm | CMD0 vm | 0 vm | 0 vm | 0 vm | 0 vm | CMD5 vm |
| WORD 2 | 0 vm | ROW7 apg | ROW6 apg | ROW5 apg | ROW4 apg | ROW3 apg | ROW2 apg | ROW1 apg | ROW0 apg | ROW9 apg | ROW8 apg |
| WORD 3 | 0 vm | BNK2 apg | BNK1 apg | BNK0 apg | COL6 apg | COL5 apg | COL4 apg | COL3 apg | COL2 apg | COL1 apg | COL0 apg |

FIG. 2.

CIRCUITS AND SYSTEMS FOR REALIGNING DATA OUTPUT BY SEMICONDUCTOR TESTERS TO PACKET-BASED DEVICES UNDER TEST

CROSS-REFERENCE TO RELATED APPLICATION

This patent application is a continuation-in-part application of pending patent application Ser. No. 09/146,629, filed on Sep. 3, 1998.

BACKGROUND OF THE INVENTION

1. Field of the Invention

The present invention relates to testing of integrated circuit devices and, in particular, to testing packet-based semiconductor memories and the devices themselves.

2. Description of the Related Art

As the complexity of semiconductor integrated circuits continues to increase, difficulties begin to arise in the use of generalized test equipment to ensure the desired operability of each device. The increasing complexity of these devices is driven largely by the need to increase speed and bandwidth and, as such, the architecture of these devices changes to achieve this result. These changes in device architecture, in many cases, make the utilization of existing test equipment difficult, if not impossible. Purchasing new test equipment is often economically undesirable, particularly if only a segment of a production line utilizes these device architectures.

The generalized test equipment used to test semiconductor integrated circuits may vary between manufacturer and intended use, but in general, the test equipment is used to monitor processes, test board and box level assemblies, and may be used to test the functionality of an integrated circuit.

One type of test equipment that is of particular interest in the case of manufacturing memory devices is referred to as a "memory tester." Hereinafter, the terms memory tester and tester will be used interchangeably. Memory testers allow for the functional testing of integrated memory circuits to identify defects at the time of test. Identification of a defective device gives the manufacturer the options of reworking, repairing, or possibly scrapping the device. Because of the cost added at each step of the manufacturing process, the earlier a defect can be discovered, the more cost efficient the manufacturing process will be.

Functionally testing integrated memory circuits typically involves the development of a logical model of the device to be tested. The model defines input pins for the application of stimuli to the device under test (DUT), and output pins for observation of the response from the DUT. Logical models are typically developed with the requirements of the intended tester in mind. With an accurate model, a measured response from a DUT can be compared against the anticipated model response, and if it does not match, then a faulty device has been detected.

In a typical tester, an algorithmic pattern generator (APG) is provided as a resource for stimuli of the input pins of a DUT. The APG typically provides a first X address generator and a second Y address generator. To illustrate the operation of an APG, imagine writing zeros into every address of a DUT. In this case, the data generator would generate a continuous "0." The X address generator would run from "0" to a predefined end address, whereas the Y address generator would maintain its initial value. Once the X address generator reaches its end address, it would be reset to "0," and the Y address generator would be increased by one, and the X address generator would again run from "0" to its end address. This process would continue until all cells of the memory under test contained a "0."

The controller of such an APG typically includes a programmable vector memory for storing test patterns. Vector memory is typically limited in size. If a sufficiently large number of test patterns are necessary to test a given device, it may require loading more than one set of test patterns in vector memory to complete the test. Thus, it is advantageous to use an APG, where possible, to preserve available vector memory and allow for more efficient operation.

A packet-based semiconductor memory operates on more than one word of information in a given cycle. The packet information could be data, address, command or any other type of data which the device is capable of receiving or outputting. The number of words in a given packet cycle is determined by the particular device architecture. The term "data packets" and "packets" are used interchangeably herein to include data, address and command information.

Because many tester APGs have only X and Y address generators, it is difficult to generate more than two bits of APG data as input stimuli to a DUT. The same problem would arise for an APG with N address generators, if one was attempting to generate more than N bits of APG data. Herein lies the problem with testing integrated memory circuits which require packet-based information. With packet-based devices, there may be a need for more than two bits of APG data per input pin as stimuli. This may require the use of vector memory to supply the additional information bits.

To illustrate the problem, consider for example, the draft specification for a 4 Megabit×18 I/O Synchronous-Link Dynamic Random Access Memory (SLDRAM). The draft specification for this packet-based semiconductor memory is titled *Draft/Advance, SLDRAM Inc., SLD4M18DR400, 4 MEG×18 SLDRAM*, Rev. Feb. 12, 1998. FIG. 1 is a table reproducing the information in a Read, Write or Row Operation Request Packet, as defined in the above referenced draft specification, page 7, which comprises four 10-bit words, WORD 0, WORD 1, WORD 2, and WORD 3. As depicted, the first row of data under the column heading represents prior data in a packet stream, which are not of concern, hence the "don't care" or "x" value placed within each bit location. Each column of data represents an input pin on the SLDRAM device, including the FLAG bit. The Command Address bits, CA0–CA9 define the 10-bit command words. The beginning of a packet is indicated by the FLAG bit being in a logical true. The FLAG bit logical true also indicates that the first word in a packet, WORD 0, is present on the CA0–CA9 bits.

The data within each of the four command words, WORD 0–3, are latched with timing signals not shown in FIG. 1. WORD 0 contains the nine identification bits, ID0–ID8, used to identify a particular SLDRAM in an array of such memory devices, as well as CMD5, which is one of six command code bits. WORD 1 contains CMD0–4, BNK0–2, and ROW8–9. The command bits CMD0–5 are used to instruct the SLDRAM to perform a particular memory operation. For example, where all six of the CMD0–5 bits are zero, the command is: Page Access, Burst of 4, Read Access, Leave Row Open, Drive DCLK0. The bank address bits BNK0–2 are used to select one of eight memory banks, where each memory bank is 1024 rows×128 columns×72 bits in size. WORD 2 contains eight of the row address bits ROW0–7, and two unused bits. WORD 3 contains seven column address bits, COL0–6, and three unused bits.

The address bits, bank, row and column are particularly suitable for algorithmic pattern generation because it is frequently the case that one wants to sequence through the addresses when performing a read or write operation. In contrast, the command code bits CMD0–5 are accessed in a more or less random order, so vector memory is more appropriate and convenient as a source of test patterns. On FIG. 1, this test pattern source preference has been indicated by the abbreviations "vm" for vector memory and "apg" for algorithmic pattern generator.

Ideally, the bank, row and column addresses would each be assigned one of the address generators in the APG. However, as noted above, conventional APGs typically have only two address generators, X and Y. To illustrate the problem, refer to FIG. 1, column CA3, which represents command address pin 3. For pin CA3, the tester must provide three pieces of algorithmic data, BNK1, ROW1, and COL3, in addition to ID2 which is sourced from vector memory. Furthermore, WORD 1, WORD 2 and WORD 3 each contain combinations of information that may be sourced from both vector memory and an APG.

In most cases, it is possible to create a description of a combination of required vectors and APG bits to accommodate each of the cycles described in a typical packet. This approach, however, requires much additional work to format pins appropriately, and may consume additional tester resources.

The cost of testing is a significant portion of integrated circuit manufacturing costs. Digital integrated circuit testers (specifically memory testers) can be costly and require significant calibration and maintenance expenses over time. The useful life of such a tester is limited by its design the number of pins, pattern depth, and signal generating and comparison speeds. These and other factors limit the number of applications the tester can be used for, due to changes in integrated circuit architecture, increasing signal speeds, increasing disparity of signal speeds, and the increasing number of functions designed into a single integrated circuit package. While it is always an option to purchase state-of-the-art test equipment to accommodate a new generation of IC, the cost is prohibitive unless absolutely necessary.

Because of the increased costs associated with designing test programs to test packet-oriented memory devices and the limited resources of conventional memory testers, there is a need in the art for devices or methods, to test packet-based semiconductor memory devices, by rearranging the signals within words of a predefined packet to allow simplified and lower cost testing with conventional tester architecture.

SUMMARY OF THE INVENTION

To overcome the problem of testing semiconductors with packet-based architectures using conventional memory test equipment, the apparatus and system of the present invention utilizes data realignment circuitry. To avoid confusion, the following terminology will be used throughout this application. The DUT is designed to accept packets in a first or "realigned" format. A conventional tester may be employed to generate test data packets in a second format different from the first. This second format is also referred to as "facilitated" test data. The data realignment circuitry of the present invention realigns test data packets from the second, facilitated format into test data packets in the first format, which the DUT can recognize. The invention reduces the number of required tester resources on a per pin basis. In other words, the inventive test mode circuitry reformats easily generated or simplified (i.e., facilitated) test data to conform with a given packet definition or specification that would otherwise be difficult to generate directly with conventional test equipment. The invention also provides methods of generating simplified test data from conventional memory test equipment and methods of realigning the simplified test data to the proper packet data specification.

FIG. 2 represents the same packet information as in a conventional Read, Write, or Row Operation Request packet definition for a 4M×18 SLDRAM (four, 10-bit command address words, plus a flag bit), but in a format that is easier to produce with conventional memory testers in accordance with the invention. Note that there is a one-to-one correspondence between the information in FIG. 1 and FIG. 2. More specifically, WORD 0 contains identification bits, ID0–8. It should be noted that it is a simple task to generate the desired identification bit data from vector memory (if required) in a single word or tick of a packet. WORD 1 contains command bits, CMD0–5, which can also be sourced easily from vector memory. WORD 2 contains the row address bits, ROW0–9, which are ideally generated using a single address generator from an APG. And finally, WORD 3 contains bank address bits, BNK0–2, and column address bits, COL0–6, which are ideally generated by one or two address generators in an APG. Note, that none of the command address bits, CA0–9, contain more than two pieces of algorithmic data.

This facilitated SLDRAM packet data is then converted back to the original SLDRAM-recognizable packet format with the inventive test mode data realignment circuitry for use by the remaining conventional SLDRAM circuitry per its specification. The inventive test mode realignment circuitry can be implemented in any one of a number of preferred embodiments.

One embodiment of the present invention includes data realignment circuitry, command and address capture, command decoding and address sequencing, memory array and data I/O on an SLDRAM. The data realignment circuitry receives command and address signals, flag and clock signals. The data realignment circuitry outputs to the command and address capture circuitry.

Another embodiment of the present invention includes data realignment timing circuitry, data realignment circuitry, command and address capture, command decoding and address sequencing, memory array, and data I/O on a memory device. The data realignment timing circuitry receives a system clock or clocks and generates one or more timing signals which are input to the data realignment circuitry. The data realignment circuitry also receives command and address signals and flag and outputs to command and address capture circuitry.

Yet another embodiment of the present invention integrates the data realignment function with the command and address latching function. Still further embodiments of the invention move the data realignment function off-chip to, respectively, a test interface and a memory tester. Computer systems may be fabricated using memory chips incorporating the inventive data realignment testing scheme. These embodiments and attendant advantages of the invention will be readily understood by reading the following detailed description in conjunction with the accompanying figures of the drawings.

BRIEF DESCRIPTION OF THE DRAWINGS

FIG. 1 is a table illustrating a data specification of a conventional SLDRAM Read, Write, or Row Operation Request command packet;

FIG. 2 is a table illustrating a reordering of the data contained in the table of FIG. 1 to facilitate simple generation with conventional memory test equipment in accordance with this invention;

DETAILED DESCRIPTION OF THE INVENTION

Figure 3:
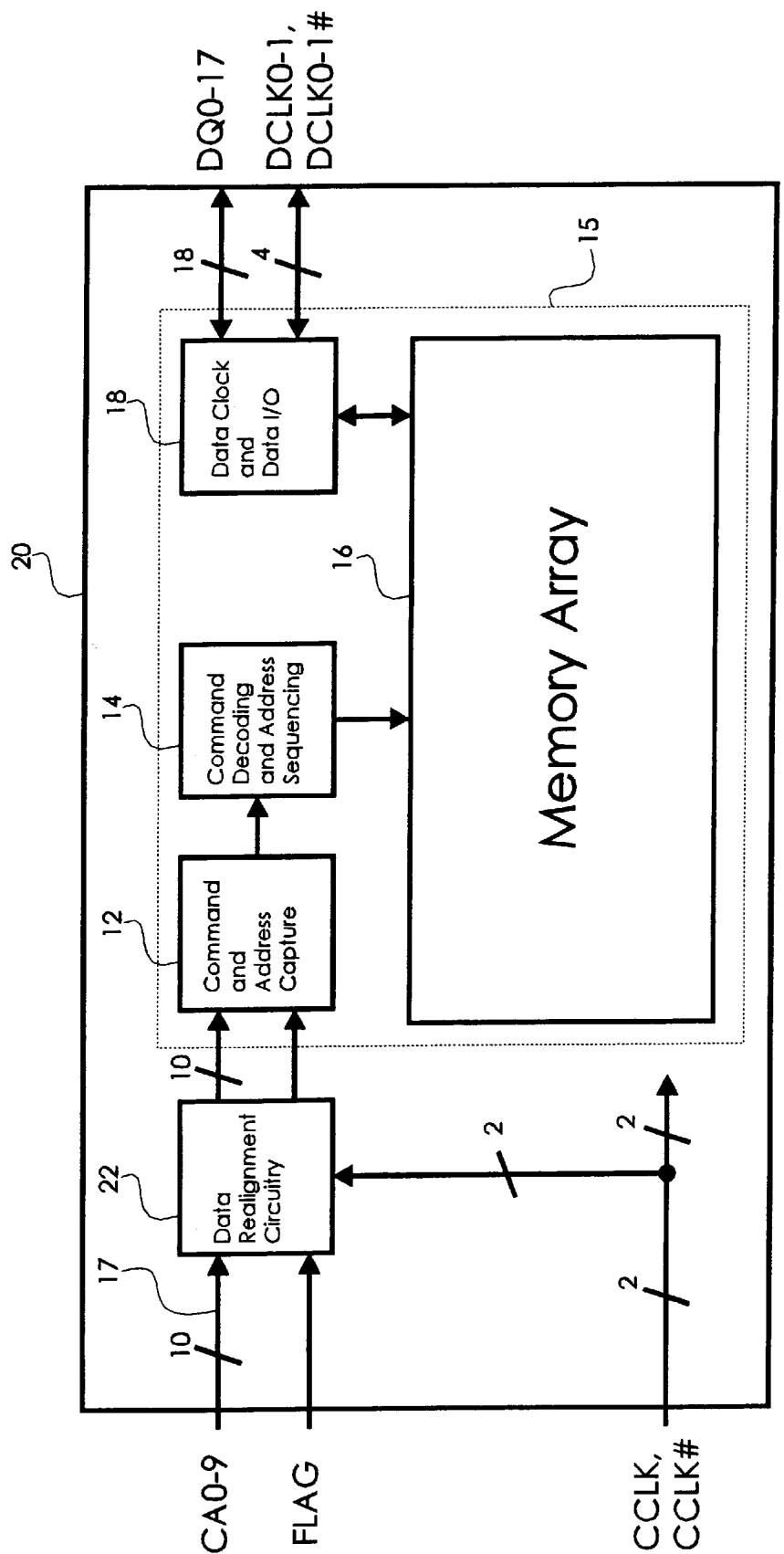
FIG. 3 is a block diagram of a first embodiment of a semiconductor memory in accordance with this invention that accepts data formatted as in FIG. 2 and realigns the data to the format of FIG. 1.

The following detailed description will refer to a memory device under test (DUT) embodied as an Synchronous-Link Dynamic Random Access Memory (SLDRAM) device, but it should be noted that the invention is not limited to SLDRAM architecture. It should be obvious to those of ordinary skill in the art that the inventive methods, apparatuses and systems could be used with other packet-oriented semiconductor memory architectures such as Rambus technology, i.e., Rambus Dynamic Random Access Memory (RDRAM), an example of which is provided in U.S. Pat. No. 5,606,717 to Farmwald et al., incorporated herein by reference; FLASH memory technology, an example of which is provided in U.S. Pat. No. 5,781,477 to Rinerson et al., incorporated herein by reference; Synchronous Dynamic Random Access Memory (SDRAM), an example of which is provided in U.S. Pat. No. 5,751,656 to Schaefer, incorporated herein by reference; Dynamic Random Access Memory (DRAM), an example of which is provided in U.S. Pat. No. 5,341,341 to Fukuzo, incorporated herein by reference; Static Random Access Memory (SRAM), an example of which is provided in U.S. Pat. No. 5,555,208 to Nishihara, incorporated herein by reference; Synchronous Static Random Access Memory (SSRAM), an example of which is provided in U.S. Pat. No. 5,684,750 to Kondoh et al., incorporated herein by reference; and a memory controller, an example of which is provided in U.S. Pat. No. 5,644,708 to Larrson, incorporated herein by reference; and any other packet-based semiconductor memory architecture, where test data is difficult to generate with conventional memory testers because of the packet-based nature of the particular device architecture.

Additionally, it should be obvious to those of ordinary skill in the art that the inventive methods, apparatuses and systems are not limited to memory devices and could be used in other packet-based devices such as: a data router, an example of which is provided in U.S. Pat. No. 5,796,740 to Perlman et al., incorporated herein by reference; a controller, an example of which is provided in U.S. Pat. No. 5,752,076 to Munson, incorporated herein by reference; a network controller, an example of which is provided in U.S. Pat. No. 5,754,789 to Nowatzyk et al., incorporated herein by reference; a microprocessor, microcontroller; or any other kind of packetbased semiconductor device. It should be noted that, the command, data and address bandwidth, true logic state (whether high or low), flags, etc., of the particular embodiments described below are exemplary only and not intended to limit the scope of this invention.

The terms "signal" and "line" may be used interchangeably. Furthermore, the terms "signal" and "line" are used herein to refer to a conductive structural member upon which a voltage (possibly time varying) can be measured with respect to a reference potential. Additionally, the terms "information packet", "data packet" and "packet" are to be used interchangeably and refer to information such as that contained in FIG. 1 or FIG. 2 and may include a FLAG bit. And finally, the terms "clock signal" and "timing signal" are used synonymously herein to refer to a time varying electrical signal used to synchronize events in electrical circuitry. Referring to FIG. 1, the specification for a Read, Write, or Row Operation Request packet for a 4M×18 SLDRAM, is shown. This packet specification is four words, WORD 0–3, by eleven bits: FLAG and CA0–9. FLAG=1, marks the beginning of an information packet or the first word, WORD 0, of the packet. The packet includes a plurality of identification bits, ID0–8, a plurality of command code bits, CMD0–5, a plurality of bank address bits, BNK0–2, a plurality of row address bits, ROW0–9 and a plurality of column address bits, COL0–6. For clarity of the description below, the following terminology will be used: FIG. 1 is an example of packet information in the "realigned" format, whereas FIG. 2 shows the same information in a "facilitated" format.

Referring to FIG. 3, a first embodiment of the invention is a packet-based semiconductor memory 20, comprising a command and address capture block 12, command decoding and address sequencing block 14, memory array 16, and data clock and data I/O 18 is provided. The memory array 16 may be of any suitable size, e.g., 4M×18. Data realignment circuitry 22 receives a plurality of command and address lines 17 (lines CA0–9 are shown in FIG. 3), a FLAG bit and system clock signals (e.g., CCLK and CCLK# as shown) as input. The data realignment circuitry 22 is configured to take the facilitated data packet of FIG. 2 and realign the information contained in the data packet to the format of FIG. 1, for use by random access memory circuitry 15. The FLAG bit information may or may not be reordered during realignment. In the example illustrated (FIG. 2 format converted to FIG. 1 format), the FLAG bit information remains in the same order (i.e., 1, 0, 0, 0). The data realignment circuitry 22 may require timing delay to accomplish the data realignment function. In this first embodiment, timing circuitry is integrated into the data realignment circuitry 22 for receiving the system clock signal and may generate additional timing signals for use by the command and address capture circuitry or other circuitry (not shown).

The command and address capture circuitry 12 latches the identification, command code, bank, row, and column address data and flag presented by the data realignment circuitry 22 and passes the information to the command decoding and address sequencing circuitry 14. The command decoding and addressing sequencing 14 controls read, write and other functions by interfacing with the memory array 16. The memory array 16 communicates with circuitry external to the packet-based semiconductor memory 20 through the data clock and data I/O 18. The data clock and data I/O 18 provides a bidirectional interface between the packet-based semiconductor memory 20 and external circuitry through a plurality of bidirectional data lines and may include a plurality of bidirectional data clock lines. By way of example, a memory array of size 4M×18 may have eighteen bidirectional data lines, DQ0–17, and four bidirectional data clock lines, DCLK0 , DCLK1, DCLK0 # and DCLK1#. It will be understood that the number of data lines is only limited by the memory configuration. Moreover, the particular internal configuration and workings of random access memory circuitry 15 is not intended to be a limitation on the applicability of the data realignment circuitry 22 to such random access memory circuitry 15.

The physical implementation of the data realignment circuitry, including timing circuitry, can be performed in any suitable combination of transistor, gate or higher level integrated circuitry by a person skilled in the art, and thus, will not be discussed in any further detail.

The data realignment circuitry may be configured to pass through data already in the format of FIG. 1. However, when the data realignment function is desired, it may be accessed by a special test mode. There are a number of ways in which a test mode might be accessed. For example, a special command code could be used, or a super-voltage applied to a particular command and address line. The physical implementation of the special test mode may be performed in any suitable manner by a person skilled in the art, and thus, will not be discussed in any further detail.

Figure 4:
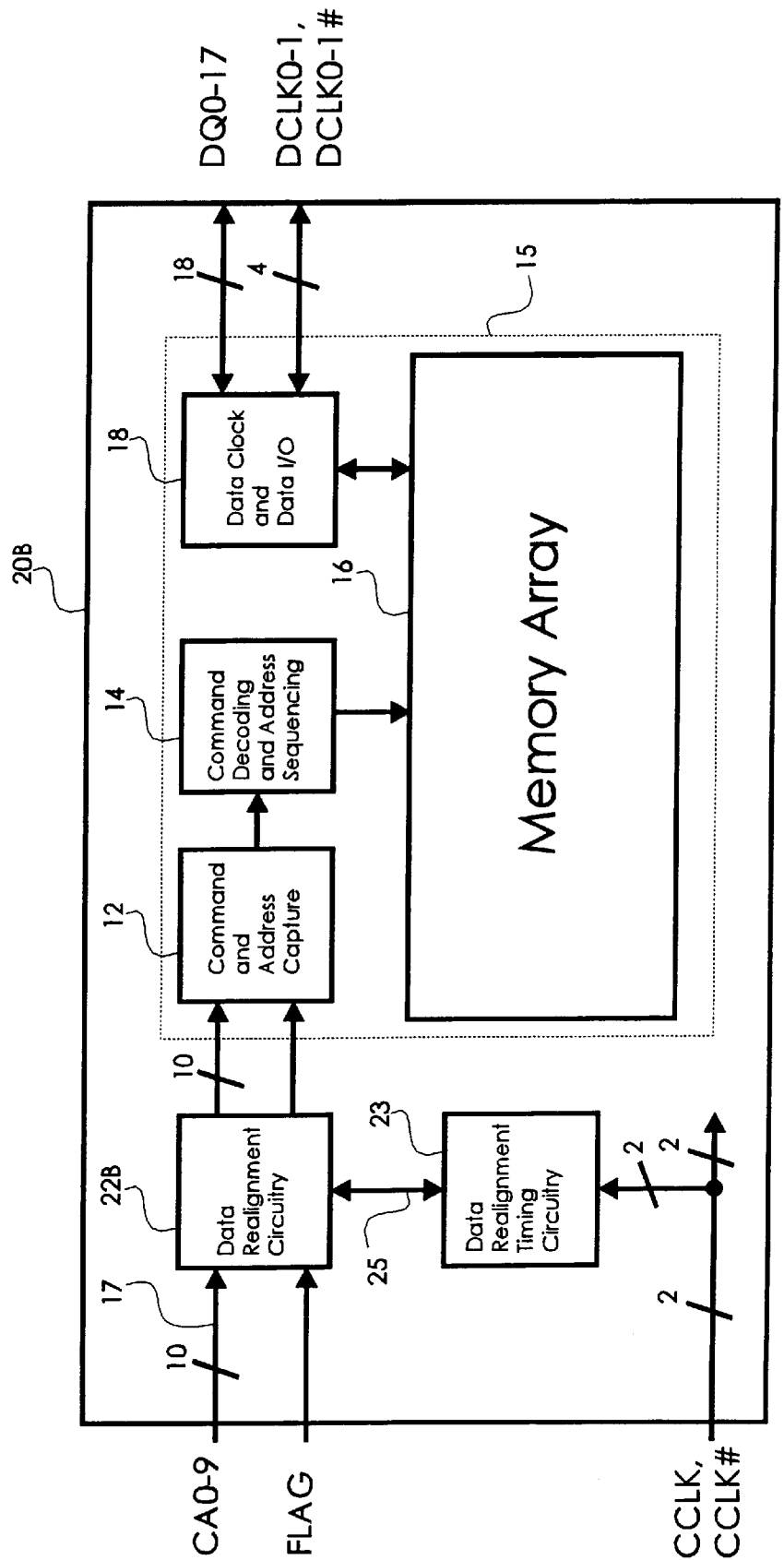
FIG. 4 is a block diagram of an alternative first embodiment of a semiconductor memory that accepts data formatted as in FIG. 2 and realigns the data to the format of FIG. 1 in accordance with this invention.

FIG. 4 illustrates another embodiment of a memory device 20 in accordance with this invention. This embodiment of the invention in a packet-based semiconductor memory 20B comprises data realignment timing circuitry 23, data realignment circuitry 22B and random access memory circuitry 15, further comprising command and address capture circuitry 12, command decoding and address sequencing circuitry 14, memory array 16, and data clock and data I/O 18. The memory array 16 could be of any suitable size, e.g., 4M×18. Data realignment circuitry 22B receives a plurality of command and address lines 17 (lines CA0–9 are shown in FIG. 4), a FLAG bit and one or more timing signals 25 (only one is shown in FIG. 4) as input. The data realignment circuitry 22B is configured to take the facilitated data packet of FIG. 2 and realign the data to the format of FIG. 1, for use by random access memory circuitry 15. The data realignment circuitry 22B may require timing delay to accomplish the data realignment function.

In this embodiment, data realignment timing circuitry 23 receives command clock signals (shown as CCLK and CCLK# in FIG. 4) and outputs one or more timing signals 25 to the data realignment circuitry 22B. The data realignment timing circuitry 23 may generate additional timing signals for use by the command and address capture circuitry 12 or other circuitry (not shown). The command and address capture circuitry 12 latches the identification, command code, bank, row, and column address data and flight presented by the data realignment circuitry 22B. Other operations of the random access memory circuitry 15 may be as described above with reference to FIG. 3. The physical implementation of the data realignment circuitry and data realignment timing circuitry may be performed in any suitable combination of transistor, gate or higher level integrated circuitry by a person skilled in the art, and thus, will not be discussed in any further detail.

Figure 5:
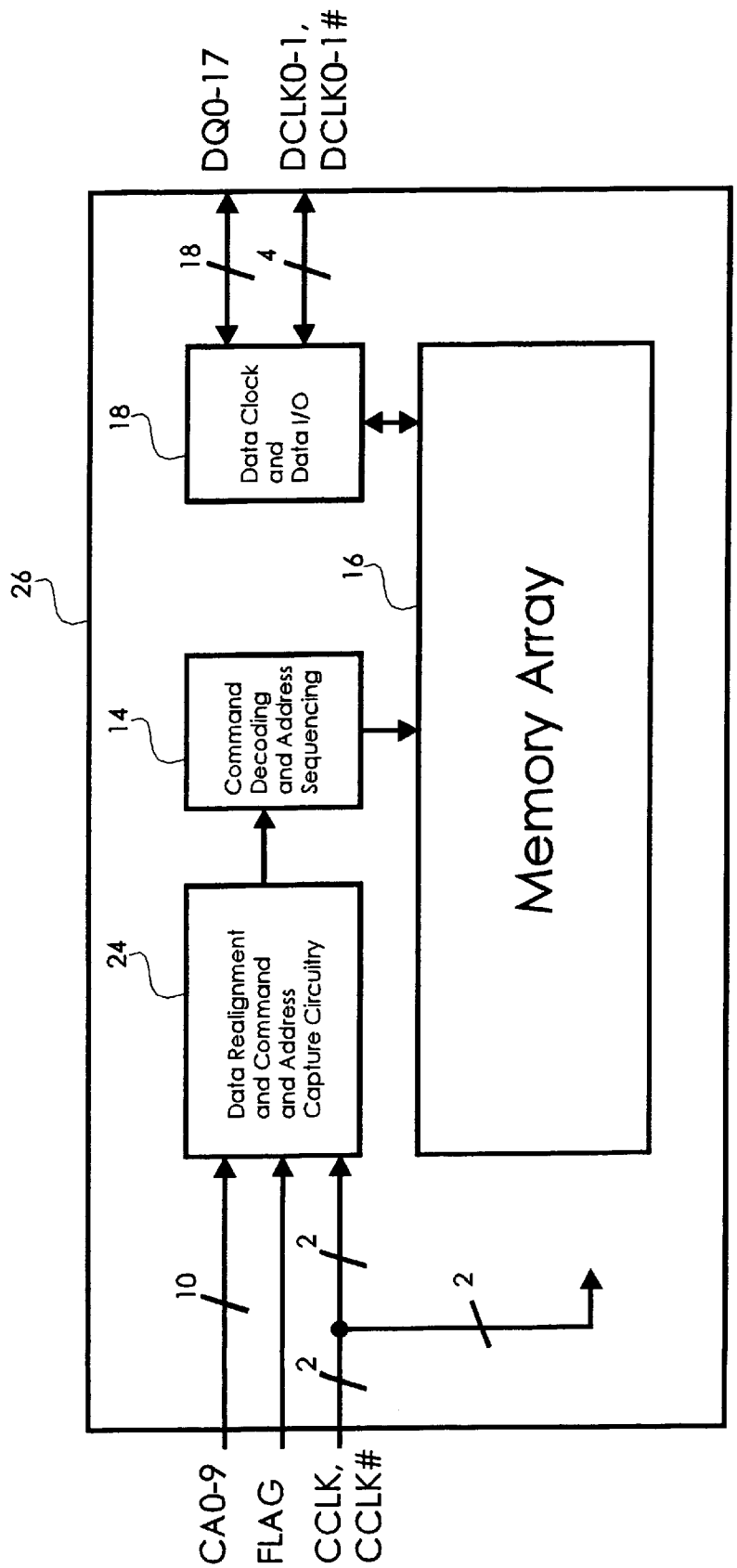
FIG. 5 is a block diagram of a second embodiment of a semiconductor memory in accordance with this invention that accepts data formatted as in FIG. 2 and realigns the data to the format of FIG. 1.

FIG. 5 shows yet another embodiment of the invention in a packet-based semiconductor memory 26. The packet-based semiconductor memory 26 includes data realignment and command and address capture circuitry 24, command decoding and address sequencing 14, memory array 16 and data clock and data I/O 18. In this embodiment, the data realignment and command and address capture circuitry 24 may combine the data realignment circuitry 22 and the command and address capture circuitry 12 of FIG. 3. Alternatively, the data realignment and command and address capture circuitry 24 may integrate data realigninent circuitry 22B, data realignment timing circuitry 23 and command and address capture circuitry 12 of FIG. 4. The remaining blocks, command decoding and address sequencing 14, memory array 16, and data clock and data I/O 18 may be substantially the same as described in FIGS. 3 and 4. This embodiment is advantageous because there is the potential for integration efficiencies in combining the packet latching function with the inventive data realignment and necessary timing functions. The design of data realignment and command and address capture circuitry 24 may be performed in any suitable combination of transistor, gate or higher level integrated circuitry by a person skilled in the art, and thus, will not be discussed in any further detail.

Figure 6:
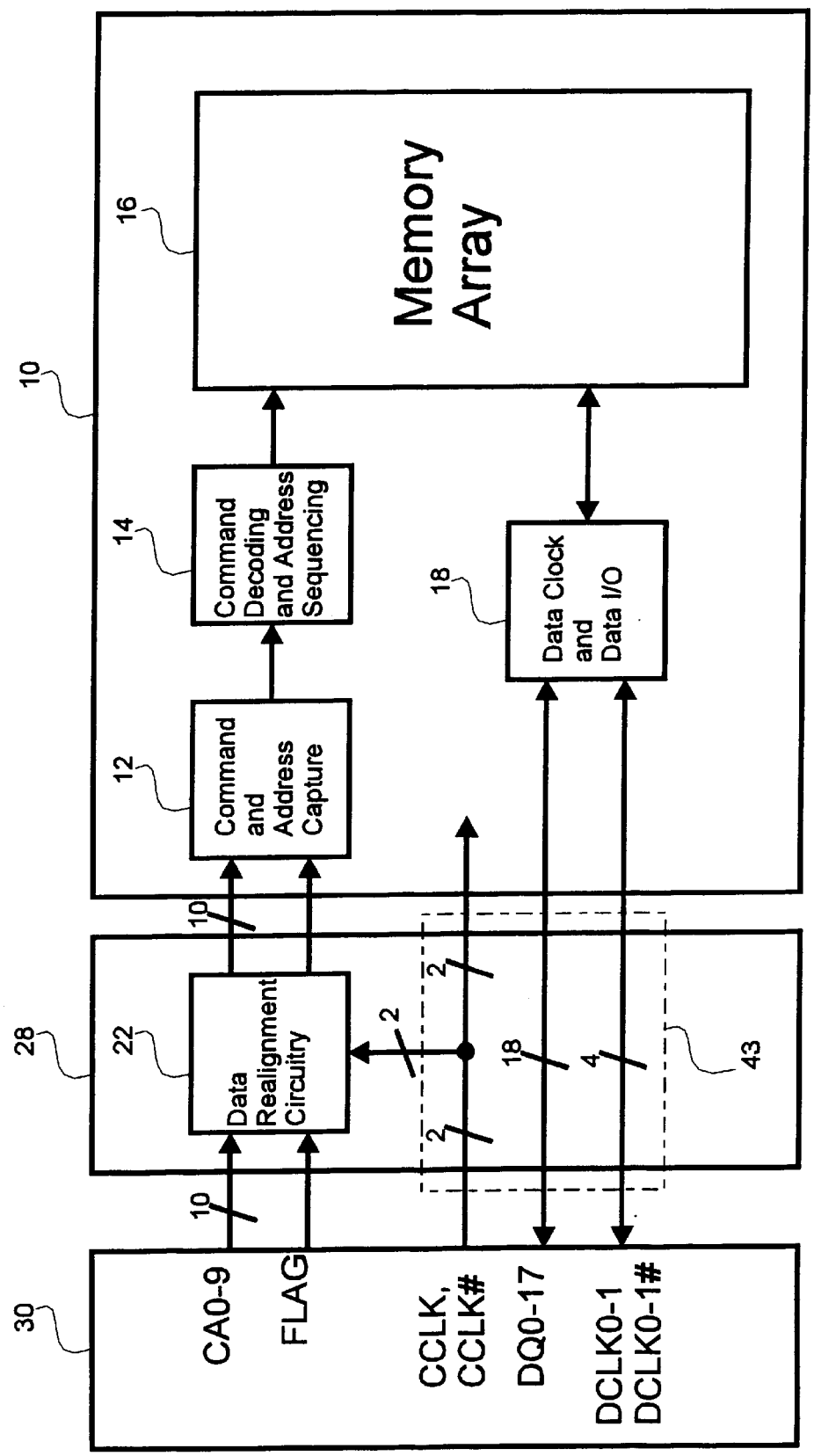
FIG. 6 is a block diagram of a test interface including data realignment circuitry in accordance with this invention.

FIG. 6 illustrates an additional embodiment of the invention where the data realignment circuitry 22 is included in a test interface 28 between the memory tester 30, which provides the test data patterns, and the memory DUT 10. The test interface 28 may have pass-through connections 43 for bidirectional data I/O, clock signals and other signals as convenient. For example as shown in FIG. 5, there may be eighteen bidirectional data I/O lines, DQ0–17, four bidirectional data clock lines, DCLK0 , DCLK1, DCLK0# and DCLK1#, and command clock lines, CCLK and CCLK#, which are essentially passed through the test interface 28 to the memory DUT 10, perhaps with a unidirectional or bidirectional buffers (not shown).

Figure 7:
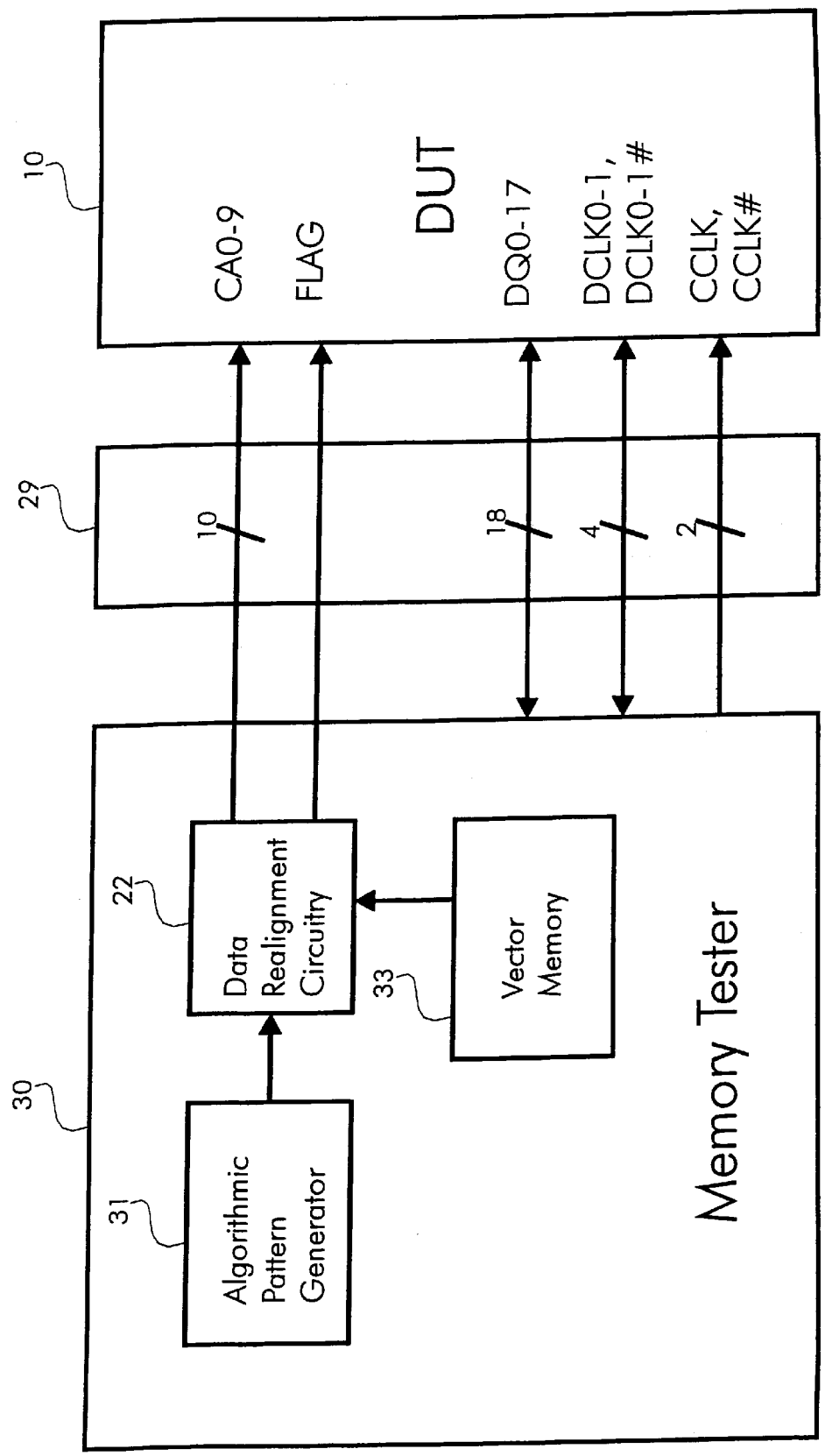
FIG. 7 is a block diagram of a memory tester including data realignment circuitry in accordance with this invention.

FIG. 7 illustrates yet another embodiment of the invention where data realignment circuitry 22 is placed on the memory tester 30 itself. A test interface 29 is shown between the memory tester 30 and the DUT 10 where such interface is needed. In this embodiment, test patterns are sourced in a facilitated format (see FIG. 2) from an algorithmic pattern generator (APG) 31, or a vector memory 33, or both, prior to data realignment 22. The data realignment circuitry 22 converts the facilitated data to the realigned format of FIG. 1. Thereafter, the realigned data is used to test the semiconductor memory DUT 10. Control of the APG 31, vector memory 33, and the data realignment circuitry 22 is performed by a controller (not shown). The particular aspects of the realigned data used to test the semiconductor memory DUT 10 are within the scope of one skilled in the art of testing semiconductors devices, and thus, will not be further discussed.

Figure 8:
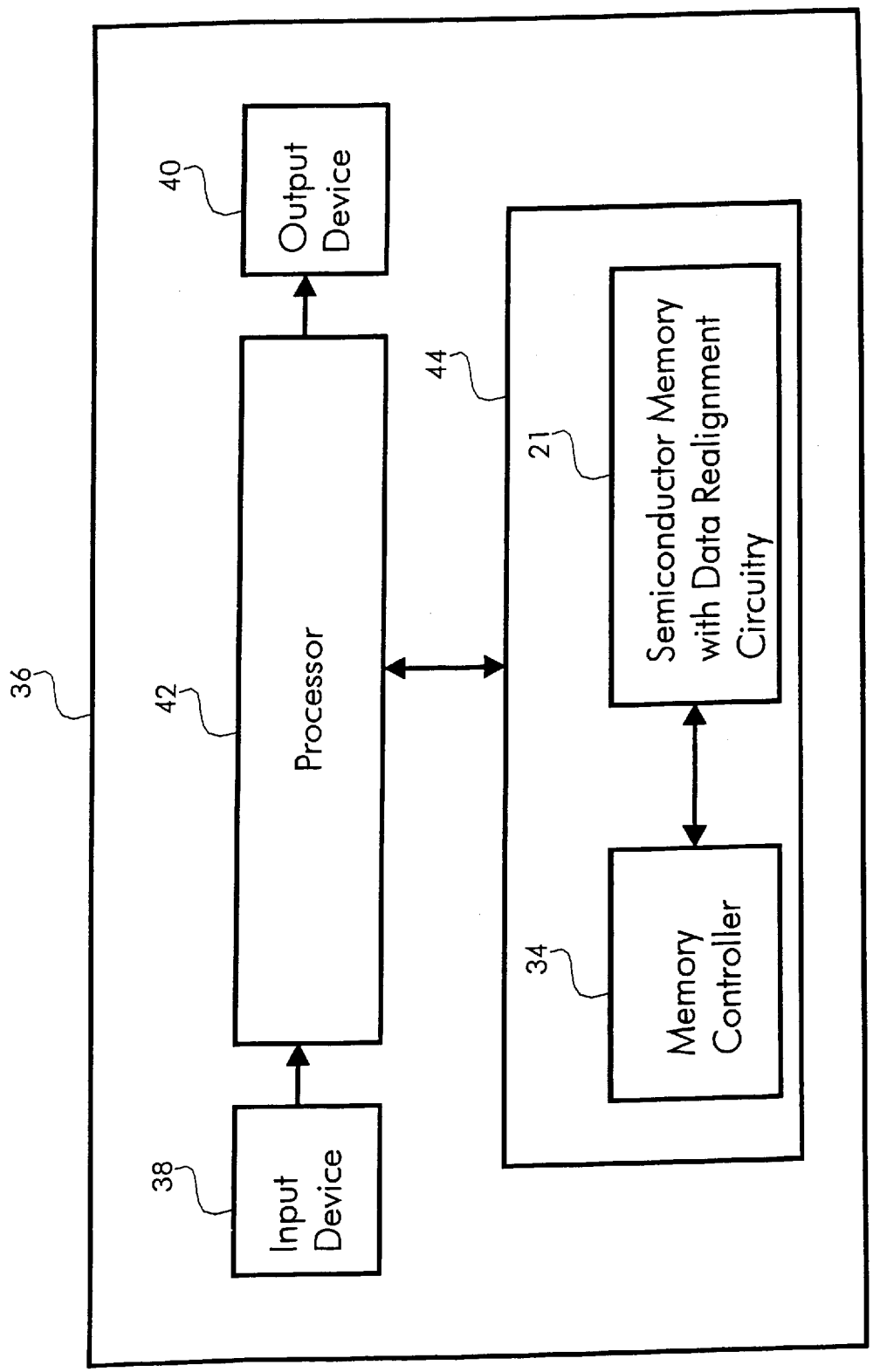
FIG. 8 is a block diagram illustrating an electronic system that includes a semiconductor memory incorporating a memory controller and semiconductor memory that includes data realignment circuitry in accordance with this invention.

Referring to FIG. 8, an electronic system 36 includes an input device 38, an output device 40, a processor device 42, and a memory device 44 that includes a memory controller 34 interacting with a semiconductor memory with data realignment circuitry 21, as illustrated in FIG. 3. The semiconductor memory with data realignment circuitry 21 may be the packet-based semiconductor memory 20 of FIG. 3, or the packet-based semiconductor memory 20B of FIG. 4, or the packet-based semiconductor memory 26 of FIG. 4. Moreover, it will be understood that the data realignment circuitry may be incorporated into any packet-based semiconductor memory, including those constructed on such memory architectures as SLDRAM, RDRAM, FLASH, SDRAM, DRAM, SRAM, SSRAM, and ROM devices where applicable.

Figure 9:
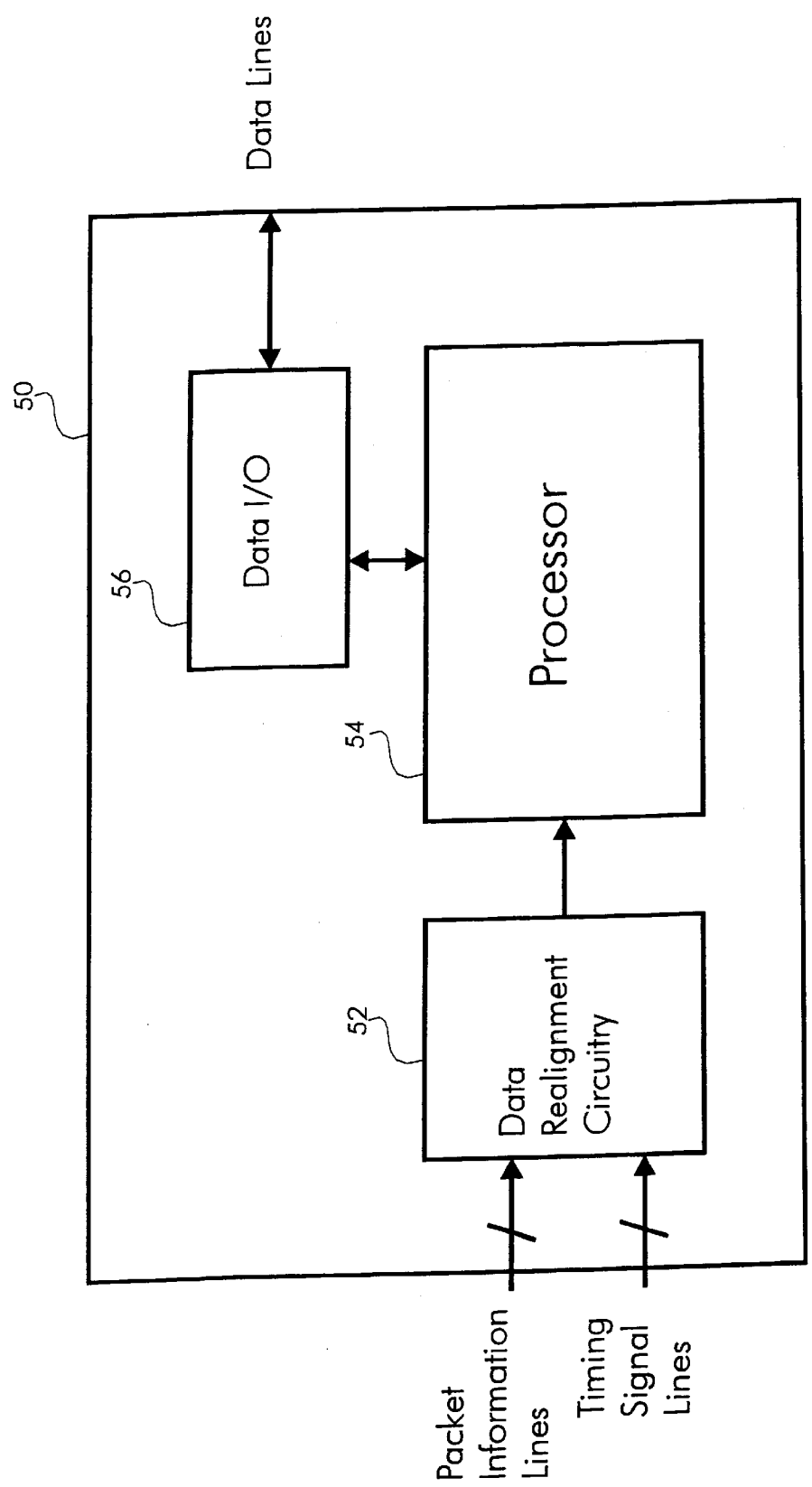
FIG. 9 is a block diagram of a packet-based semiconductor device including data realignment circuitry in accordance with this invention.

Referring now to FIG. 9, yet another embodiment of the invention is shown schematically as a packet-based semiconductor device 50. In this embodiment, the packet-based semiconductor device 50 includes data realignment circuitry 52 coupled to a processor 54, which is in turn coupled to data I/O circuitry 56. A plurality of packet data lines and one or more timing signals are input to the data realignment circuitry 52. The data realignment circuitry converts packet information from a facilitated format, to a realigned format. The realigned packet information is then used by the processor 54 to perform one or more operations based on the commands embedded in the realigned packet information. The data I/O circuitry 56 provides a bidirectional data path from the packet-based semiconductor device 50 to external circuitry (not shown) to perform one or more predefined tasks as necessary according to processor command operations.

Figure 10:
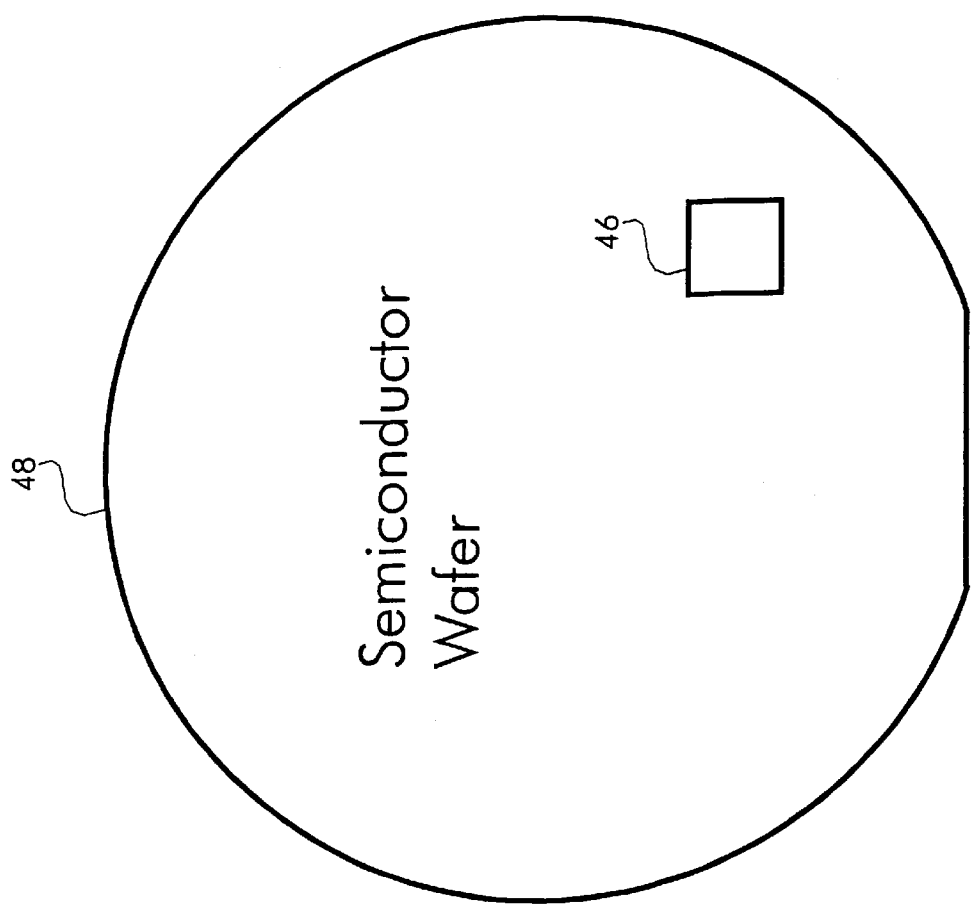
FIG. 10 is a diagram illustrating a semiconductor wafer on which the data realignment circuitry in accordance with this invention is fabricated.

In FIG. 10, an integrated circuit die 46 is provided on a semiconductor wafer 48. It should be understood that the integrated circuit die 46 on the semiconductor wafer 48 may comprise the packet-based semiconductor memory 20, 20B or 26 of FIGS. 3A, 3B and 4, respectively. Alternatively, the integrated circuit die 46 may comprise any packet-based semiconductor device 50, including the inventive data realignment circuitry.

The semiconductor technology employed is not a limiting factor in the application of the inventive data alignment circuitry. While silicon is the preferred bulk semiconductor material for commercial electronic devices, gallium arsenide and indium phosphide substrates may also be employed. Of course, it will be understood that the inventive data realignment circuitry may be fabricated on other semiconductor substrates as well, including, for example, silicon-on-glass (SOG) substrates, silicon on-insulator (SOI) substrates, and silicon-on-sapphire (SOS) substrates.

A method of aligning test data packets, according to this invention, for packetbased memory devices may be described as follows. First, identify blocks of data, if any, within a given first packet format that can be generated using an algorithmic pattern generator. Second, identify remaining blocks of data, if any, within the first packet format which must be generated from vector memory. Then, rearrange the identified blocks of algorithmically generatable data by moving said data into as few adjacent packet words as possible forming a test data packet in a second, facilitated format different from the first, DUT-recognizable format. This transformation of data bits from the first format to the second format is performed by exchanging data bits, thus preserving a one-to-one correspondence between each data bit of the first and second formats. The method of realigning test data packets, according to this invention, is precisely the reverse of the method of rearranging just described, i.e., the test data packet in a second format is realigned to a test data packet in a first format.

Although this invention has been described with reference to particular embodiments, the invention is not limited to these described embodiments. Rather, it should be understood that the embodiments described herein are merely exemplary and that a person skilled in the art may make many variations and modifications without departing from the spirit and scope of the invention. All such variations and modifications are intended to be included within the scope of the invention as defined in the appended claims.

What is claimed is:

1. A data realignment circuit comprising:
   a plurality of input signals;
   a plurality of output signals; and
   data realignment circuitry disposed between said plurality of input signals and said plurality output signals configured for receiving facilitated test data packets from said plurality of input signals, converting said facilitated test data packets into realigned test data packets and outputting said realigned test data packets on said plurality of output signals.

2. The data realignment circuit of claim 1, wherein said plurality of input signals includes at least one timing signal.

3. The data realignment circuit of claim 1, wherein said facilitated test data packets and said realigned test data packets each include identification bits, command code bits, row address bits, column address bits and bank address bits.

4. A packet-based semiconductor memory comprising:
   a plurality of input signals;
   data realignment circuitry for receiving facilitated test data packets and a timing signal from said plurality of input signals and outputting realigned test data packets; and
   random access memory circuitry for receiving said realigned test data packets and performing at least one memory operation in accordance with information in said realigned test data packets.

5. The packet-based semiconductor memory of claim 4, wherein said plurality of input signals includes a flag signal.

6. The packet-based semiconductor memory of claim 4, wherein said facilitated test data packets and said realigned test data packets each include identification bits, command code bits, row address bits, column address bits and bank address bits.

7. The packet-based semiconductor memory of claim 4, wherein said random access memory circuitry further comprises:
   a memory array;
   command and address capture circuitry for latching said realigned test data packets; and
   command decoding and address sequencing circuitry disposed between said command and address capture circuitry and said memory array for decoding memory operation command codes and sequencing addresses embedded in said realigned test data packets.

8. The packet-based semiconductor memory of claim 7, wherein said random access memory circuitry further comprises:
   a plurality of output signals; and
   data I/O circuitry disposed between said memory array and said plurality of output signals for sending data from said memory array and receiving data into said memory array.

9. A packet-based semiconductor memory comprising:
   a plurality of input signals including a clock signal;
   data realignment timing circuitry for receiving said clock signal and generating at least one data realignment timing signal;
   data realignment circuitry for receiving facilitated test data packets from said plurality of input signals and outputting realigned test data packets in accordance with said at least one data realignment timing signal; and
   random access memory circuitry for receiving said realigned test data packets and performing at least one memory operation in accordance with information in said realigned test data packets.

10. The packet-based semiconductor memory of claim 9, wherein said random access memory circuitry further comprises:
    a memory array for storing data;
    command and address capture circuitry for latching said realigned test data packets;

command decoding and address sequencing circuitry disposed between said command and address capture circuitry and said memory array for decoding memory operation command codes and sequencing addresses embedded in said realigned test data packets;

a plurality of output signals; and data I/O circuitry disposed between said memory array and said plurality of output signals for sending data from said memory array and receiving data into said memory array according to said decoded memory operation command codes.

11. The packet-based semiconductor memory of claim 10, wherein said addresses embedded in said realigned test data packets each comprise a plurality of row address bits, a plurality of column address bits and a plurality of bank address bits.

12. A data realignment command and address capture circuit comprising:

a plurality of input signals including a clock signal;

a plurality of output signals; and data realignment command and address capture circuitry disposed between said plurality of input signals and said plurality of output signals configured for receiving facilitated test data packets from said plurality of input signals, converting said facilitated test data packets into realigned test data packets and latching said realigned test data packets on said plurality of output signals.

13. The data realignment command and address capture circuit of claim 12, wherein said plurality of input signals include flag and timing signals.

14. The data realignment command and address capture circuit of claim 12, wherein said facilitated test data packets and said realigned test data packets each include identification bits, command code bits, row address bits, column address bits and bank address bits.

15. A packet-based semiconductor memory comprising:

a plurality of input signals including a clock signal;

data realignment command and address capture circuitry disposed between said plurality of input signals and configured for receiving facilitated test data packets from said plurality of input signals, converting said facilitated test data packets into realigned test data packets and latching said realigned test data packets;

a memory array for storing data;

command decoding and address sequencing circuitry disposed between said data realignment command and address capture circuitry for decoding memory operation command codes and sequencing addresses embedded in said latched realigned test data packets;

a plurality of output signals; and data I/O circuitry disposed between said memory array and said plurality of output signals for sending data from said memory array and receiving data into said memory array according to said decoded memory operation command codes.

16. A packet-based semiconductor device comprising:

a plurality of packet information lines;

at least one timing signal line;

at least one processor;

data realignment circuitry configured for receiving facilitated test data packets from said plurality of packet information lines and said at least one timing signal line, converting said facilitated test data packets into realigned test data packets and outputting said realigned test data packets to said at least one processor for processing according to command codes embedded within said realigned test data packets.

17. The packet-based semiconductor device of claim 16, wherein the packet-based semiconductor device further comprises data I/O for communicating with external circuitry through a plurality of bidirectional data lines.

18. A test interface for interfacing a memory tester to at least one packet-based semiconductor memory DUT, the test interface including data realignment circuitry wherein said data realignment circuitry comprises:

a plurality of input signals including a clock signal;

a plurality of output signals; and data realignment circuitry disposed between said plurality of input signals and said plurality of output signals configured for receiving facilitated test data packets from said plurality of input signals, converting said facilitated test data packets into realigned test data packets and outputting said realigned test data packets on said plurality of output signals.

19. A test interface for interfacing a memory tester to at least one packet-based semiconductor memory DUT, the test interface comprising:

a plurality of input signals including a clock signal;

a plurality of output signals;

data realignment timing circuitry for receiving said clock signal and generating at least one data realignment timing signal; and data realignment circuitry for receiving facilitated test data packets from said plurality of input signals and outputting realigned test data packets on said plurality of output signals in accordance with said at least one data realignment timing signal.

20. The test interface of claim 19, further comprising a plurality of bidirectional data lines.

21. The test interface of claim 20, further comprising signal buffers for each of said plurality of bidirectional data lines.

22. A memory tester for testing memory devices comprising:

at least one algorithmic pattern generator;

at least one vector memory; and data realignment circuitry, wherein said data realignment circuitry comprises:

a plurality of input signals including a clock signal;

a plurality of output signals; and data realignment circuitry disposed between said plurlaity of input signals and said plurality of output signals configured for receiving facilitated test data packets from said plurality of input signals, converting said facilitated test data packets into realigned test data packets and outputting said realigned test data packets on said plurality of output signals.

23. An electronic system comprising an input device, an output device, a memory device, and a processor device operably coupled to the input, output, and memory device, wherein the memory device comprises:

a memory controller; and at least one packet-based semiconductor memory coupled to the memory controller, the at least one packet-based semiconductor memory including:

a plurality of input signals including a clock signal;

a plurality of output signals; and data realignment circuitry disposed between said plurality of input signals and said plurality of output signals configured for receiving facilitated test data packets from said plurality of input signals, converting said facilitated test data packets into realigned test data packets and outputting said realigned test data packets on said plurality of output signals.

24. A semiconductor substrate having at least one packet-based semiconductor memory fabricated thereon, the at least one packet-based semiconductor memory comprising:

a plurality of input signals;

data realignment circuitry for receiving facilitated test data packets and a timing signal from said plurality of input signals and outputting realigned test data packets; and random access memory circuitry for receiving said realigned test data packets and performing at least one memory operation in accordance with information in said realigned test data packets.

25. The semiconductor substrate of claim 24, wherein said random access memory circuitry further comprises:

a memory array for storing data;

command and address capture circuitry for latching said realigned test data packets;

command decoding and address sequencing circuitry disposed between said command and address capture circuitry and said memory array for decoding memory operation command codes and sequencing addresses embedded in said realigned test data packets;

a plurality of output signals; and data I/O circuitry disposed between said memory array and said plurality of output signals for sending data from said memory array and receiving data into said memory array according to said decoded memory operation command codes.

* * * * *

UNITED STATES PATENT AND TRADEMARK OFFICE
CERTIFICATE OF CORRECTION

PATENT NO.    : 6,181,616 B1
DATED         : November 30, 2001
INVENTOR(S)   : Phillip E. Byrd It is certified that error appears in the above-identified patent and that said Letters Patent is hereby corrected as shown below:

Column 3,
Line 32, change "design the" to -- design-the --

Column 7,
Line 57, change "flight" to -- flag --

Column 8,
Line 61, after "memory 26" change "of FIG. 4" to -- of FIG.5 --

Column 9,
Line 22, change "3A, 3B, and 4," to -- 3, 4, and 5, --

Signed and Sealed this

Seventeenth Day of February, 2004

JON W. DUDAS
*Acting Director of the United States Patent and Trademark Office*